United States Patent
Kothandaraman et al.

(10) Patent No.: US 6,624,499 B2
(45) Date of Patent: Sep. 23, 2003

(54) SYSTEM FOR PROGRAMMING FUSE STRUCTURE BY ELECTROMIGRATION OF SILICIDE ENHANCED BY CREATING TEMPERATURE GRADIENT

(75) Inventors: Chandrasekharan Kothandaraman, Bogota, NJ (US); S. Sundar Kumar Iyer, Beacon, NY (US); Subramanian Iyer, Mt. Kisco, NY (US); Chandrasekhar Narayan, Hopewell Junction, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/247,415

(22) Filed: Sep. 19, 2002

(65) Prior Publication Data

US 2003/0160297 A1 Aug. 28, 2003

Related U.S. Application Data

(60) Provisional application No. 60/360,372, filed on Feb. 28, 2002.

(51) Int. Cl.$^7$ ................................................ H01L 29/00
(52) U.S. Cl. ...................... 257/529; 438/132; 438/215; 438/281; 438/333; 438/468; 327/525
(58) Field of Search ........................... 257/529; 438/132, 438/215, 281, 333, 468; 327/525

(56) References Cited

U.S. PATENT DOCUMENTS

| | | | |
|---|---|---|---|
| 5,708,291 A | | 1/1998 | Bohr et al. |
| 5,789,970 A | * | 8/1998 | Denham ..................... 327/525 |
| 6,323,535 B1 | | 11/2001 | Iyer et al. |
| 6,433,404 B1 | * | 8/2002 | Iyer et al. ................... 257/529 |

OTHER PUBLICATIONS

A. G. Domenicucci, Characterization of Electrically Pulsed Chromium Disilicide Fusible Links, Mat. Res. Soc. Symp. Proc., pp. 103–108, vol. 523, 1998 Materials Research Society, Hopewell Junction, NY.

Alexander Kalnitsky, et al., CoSi$^2$ Integrated Fuses on Poly Silicon for Low Voltage 0.18um CMOS Application, 0–7803–5413–3/99/$10.00© 1999 IEEE, Santa Clara, CA.

Mohsen Alavi, et al, A PROM Element Based on Salicide Agglomeration of Poly Fuses in a CMOS logic Process, IEEE International Electron Devices Meeting (Dec. '97), Hillsboro, OR.

* cited by examiner

*Primary Examiner*—Steven Loke
*Assistant Examiner*—Thomas Magee
(74) *Attorney, Agent, or Firm*—Jackson Walker L.L.P.

(57) ABSTRACT

The present invention provides a system, apparatus and method of programming via electromigration. A semiconductor fuse which includes a cathode and an anode coupled by a fuse link having an electrically conductive component, such as silicide, is coupled to a power supply. A potential is applied across the conductive fuse link via the cathode and anode in which the potential is of a magnitude to initiate electromigration of silicide from a region of the semiconductor fuse reducing the conductivity of the fuse link. The electromigration is enhanced by effectuating a temperature gradient between the fuse link and one of the cathode and anode responsive to the applied potential. Portions of the semiconductor fuse are selectively cooled in a heat transfer relationship to increase the temperature gradient. In one embodiment, a heat sink is applied to the cathode. The heat sink can be a layer of metal coupled in close proximity to the cathode while insulated from the fuse link. In another embodiment, the temperature gradient is increased by selectively varying the thickness of the underlying oxide layer such that the cathode is disposed on a thinner layer of oxide than the fuse link.

12 Claims, 3 Drawing Sheets

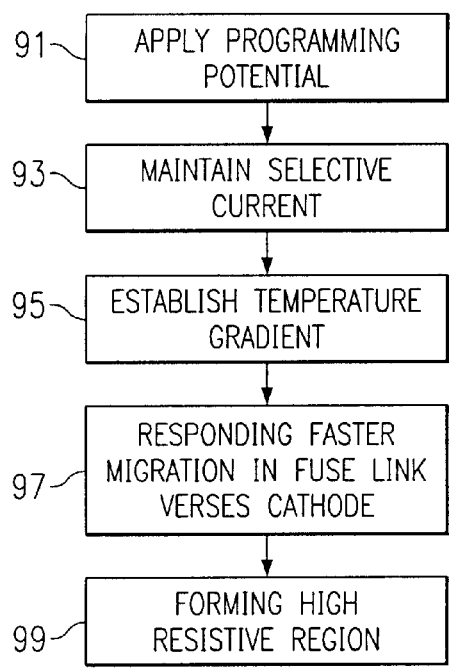
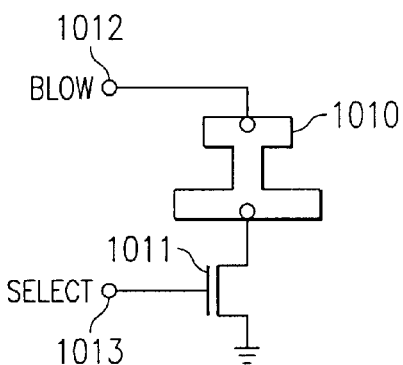
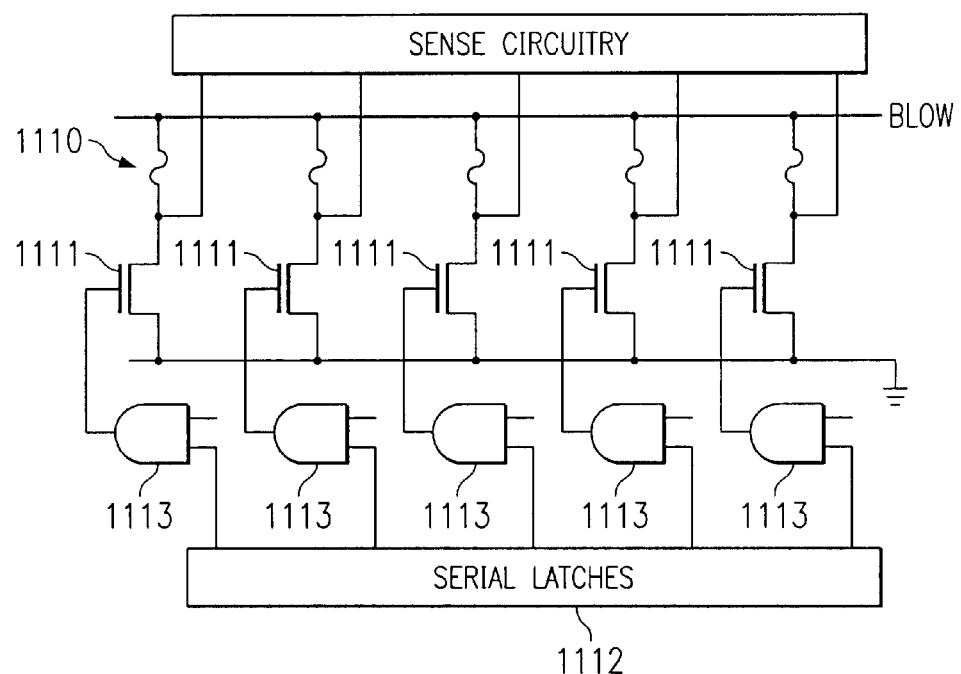

SYSTEM FOR PROGRAMMING FUSE STRUCTURE BY ELECTROMIGRATION OF SILICIDE ENHANCED BY CREATING TEMPERATURE GRADIENT

This application claims the priority under 35 U.S.C. 119(e)(1) of U.S. provisional application No. 60/360,372, filed on Feb. 28, 2002 and incorporated herein by reference.

BACKGROUND OF THE INVENTION

1. Technical Field of the Invention

The invention relates generally to the field of integrated circuits and, more particularly, to fusible link programming by electromigration in semiconductor integrated circuits.

2. Description of Related Art

In integrated circuits including CMOS integrated circuits, it is often desirable to be able to permanently store information, or to form permanent connections of the integrated circuit after it is manufactured. Fuses or devices forming fusible links are frequently used for this purpose. Fuses can also be used to program redundant elements to replace identical defective elements, for example. Further, fuses can be used to store die identification or other such information, or to adjust the speed of a circuit by adjusting the resistance of the current path.

One type of fuse device is "programmed" or "blown" using a laser to open a link after a semiconductor device is processed and passivated. This type of fuse device requires precise alignment of the laser on the fuse device to avoid destroying neighboring devices. This and other similar approaches can result in damage to the device passivation layer, and thus, lead to reliability concerns. For example, the process of blowing the fuse can cause a hole in the passivation layer when the fuse material is displaced.

Another type of fuse device is based on rupture or silicide agglomeration of polyfuses. These type of fuses include a silicide layer disposed on a polysilicon layer. Contacts are coupled to the silicide layer in a pair of contact regions on either side of a fuse element to provide an electrical connection between the fuse and external components for programming and sensing (as shown in FIG. 1A). FIG. 1B illustrates a top view of the typical shape and includes the fuse element and contact regions. FIG. 2 shows a vertical cross-section view of a typical fuse construction in which the polysilicon layer 20 and the silicide layer 22 are provided at a uniform thickness disposed on an oxide layer 26 also of a uniform thickness. Generally, a nitride capping layer 24 is also provided over layers 20 and 22.

The silicide layer 22 has a first resistance and the polysilicon layer 20 has a second resistance which is greater than the first resistance. In an intact condition, the fuse link has a resistance determined by the resistance of the silicide layer 22. In current methods of operation, a bias is applied across the fuse resulting in either agglomeration of the silicide or a complete rupture of the fuse link. In the former method, the fuse link has a resultant resistance determined in part by that of the underlaying polysilicon layer 20. Here, the change in resistance may not be sufficient. The latter method of programming the fuse device can damage surrounding structure and/or suffers from unreliable sensing. That is, the programmed fuse resistance is unreliable, as can be shown in reliability stress testing, because of the inconsistent nature of the rupture and/or the relatively small change typically offered in the programmed resistance. Further, these types of device programming may not be viable for use with many of the latest process technologies because of the required programming potentials, i.e. current flow and voltage levels over a requisite amount of time. The rupture method of programming also results in restrictions of metal interconnect wiring over the fuse.

Therefore, a need exists for a programming method and apparatus which initiates and aids mass transport processes to reduce the programming current, voltage and/or programming time while at the same time ensuring a reliable high and reproducible 'programmed resistance'.

SUMMARY OF THE INVENTION

The present invention achieves technical advantages as a system, apparatus and method of programming via electromigration. A semiconductor fuse which includes a cathode and an anode coupled by a fuse link having an electrically conductive component, such as silicide, is coupled to a power supply. A potential is applied across the conductive fuse link via the cathode and anode in which the potential is of a magnitude and direction to initiate electromigration of silicide from a region of the semiconductor fuse reducing the conductivity of the fuse link. The effectiveness of programming is enhanced by commencing a temperature gradient between the fuse link and the cathode responsive to the applied potential. Portions of the semiconductor fuse can be selectively cooled in a heat transfer relationship to increase the temperature gradient. In one embodiment, a heat sink is applied to the cathode. The heat sink can be a layer of metal coupled in close proximity to the cathode while insulated from the fuse link. In another embodiment, the temperature gradient is increased by selectively varying the thickness of the underlying oxide layer such that the cathode is disposed on a thinner layer of oxide than the fuse link.

BRIEF DESCRIPTION OF THE DRAWINGS

For a more complete understanding of the present invention, reference is made to the following detailed description taken in conjunction with the accompanying drawings wherein:

FIG. 9 show a flow diagram illustrating a method for programming a fuse in accordance with an exemplary embodiment of the present invention;

FIG. 10 illustrates a current limiting circuit for electromigration programming in accordance with an exemplary embodiment of the present invention; and FIG. 11 illustrates an electromigration programmable fuse-bank in accordance with an exemplary embodiment of the present invention.

DETAILED DESCRIPTION

Figure 1A:
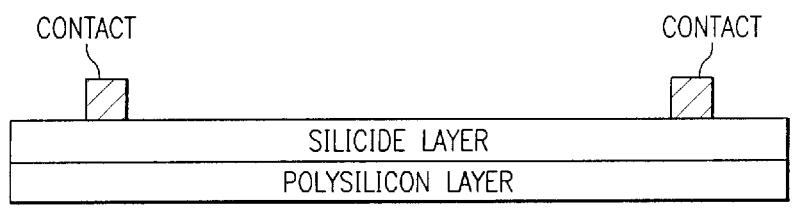
FIG. 1A illustrates a side view of a fusible link device.
Figure 1B:
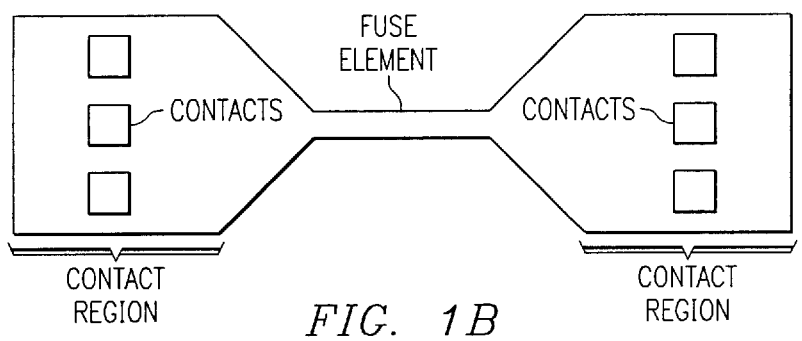
FIG. 1B illustrates a top view of a fusible link device.
Figure 2:
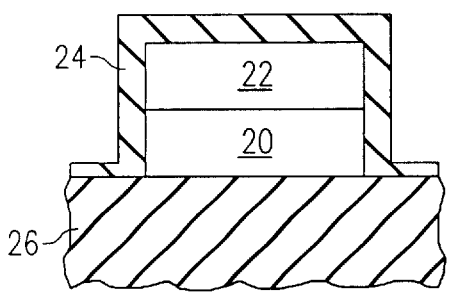
FIG. 2 illustrates a cross-sectional view of a fuse link device.

The numerous innovative teachings oft he present application will be described with particular reference to the presently preferred exemplary embodiments. However, it should be understood that this class of embodiments provides only a few examples of the many advantageous uses and innovative teachings herein. In general, statements made in the specification of the present application do not necessarily delimit any of the various claimed inventions. Moreover, some statements may apply to some inventive features, but not to others. Throughout the drawings, it is noted that the same reference numerals or letters will be used to designate like or equivalent elements having the same function. Detailed descriptions of known functions and constructions unnecessarily obscuring the subject matter of the present invention have been omitted for clarity.

In accordance with an embodiment of the present invention, a semiconductor fuse which includes a cathode and an anode connected by a fuse link is programmed by electromigration. The fuse link is comprised of a conductive component such as a metal or metal silicide for making the fuse link conductive. The silicide can be, for example, titanium silicide, nickel silicide, etc., or metals such as titanium, tungsten aluminum, copper, etc. For illustrative purposes we hereinafter refer to the conductive material as silicide. A potential is applied across the conductive fuse link via the cathode and anode for providing an associated current of a magnitude and direction to initiate electromigration of the silicide from a portion of the fuse link, leaving behind a highly resistive region. The current is limited to prevent complete rupture of the fuse link (i.e. the original fuse link structure remains mostly intact after programming). The movement of the silicide greatly reduces the conductivity of the fuse and correspondingly increases the resistance of the fuse (i.e. the fuse is programmed).

In another embodiment, programming of the fuse link is enhanced by accentuating the temperature gradient, between the fuse link and the cathode, responsive to the applied potential such that the silicide in the fuse link migrates faster than that in the cathode. This abetting of the material migration process advantageously permits lower programming voltage/current and/or programming time. A portion of the semiconductor fuse is selectively cooled in a heat transfer relationship to increase the temperature gradient. In one embodiment, a heat sink is applied to the cathode. The heat sink can be a layer of metal coupled in close proximity to the cathode while insulated from the fuse link. In another embodiment, the temperature gradient is increased by selectively varying the thickness of an underlying insulating layer such that the cathode is disposed on a thinner layer of insulation than the fuse link.

Referring now in specific detail to the drawings in which like reference numerals identify similar or identical elements throughout the several views, and initially to FIG. 9, a flow diagram is shown illustrating a method for electromigration programming in accordance with an exemplary embodiment of the present invention. First, a potential is applied between the cathode and anode 91 for starting a current flow from the anode to the cathode through the fuse link and a corresponding electron wind from the cathode to the anode. Silicide migration is establish in the direction of the electron wind. The current is selectively maintained 93 to maximize electromigration programming while preventing thermal rupture of the fuse link of the silicide. A temperature gradient is established 95 between the fuse link and the cathode, responsive to the applied current, in which the cathode is cooler than the anode. Since the rate of electromigration is exponentially dependent on the temperature, the higher the temperature the higher the electromigration. Thus, the silicide selectively migrates faster in the fuse link than in the cathode responsive to the established temperature gradient 97. Over a period of time, the faster rate of migration causes an evacuation of silicide from the fuse link forming a high resistive region resulting in programming of the fuse 99.

Figure 8A:
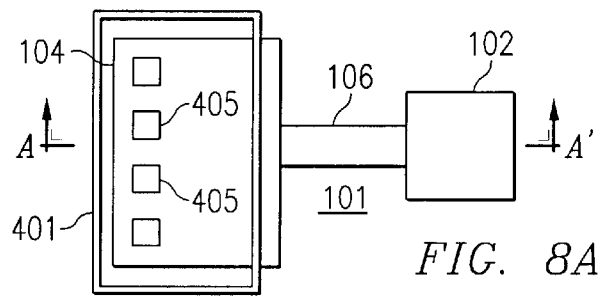
FIG. 8A illustrates a schematic top view of semiconductor fuse in accordance with another exemplary embodiment of the present invention.
Figure 8B:
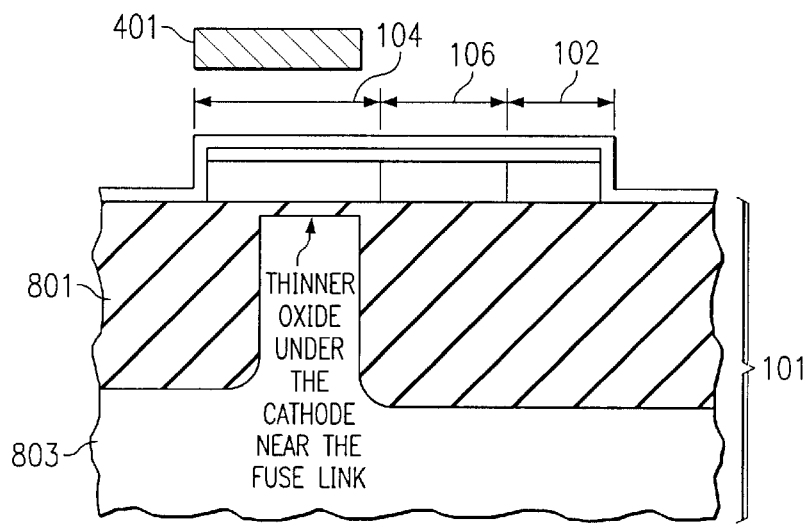
FIG. 8B illustrates a schematic cross-section view along AA' of the semiconductor fuse illustrated in FIG. 8A.

Referring now to FIGS. 8A and 8B there are illustrated schematic top and cross-section views of a semiconductor fuse in accordance with an exemplary embodiment of the present invention. Fuse 100 includes an anode 102 and a cathode 104 for providing current flow across a fuse link 106 that connects anode 102 to cathode 104. Anode 102, cathode 104 and fuse link 106 are preferably disposed on a substrate 101, which may include a semiconductor substrate, diffusion regions, metal lines, dielectric layer and other components. For programming, cathode 104 is negatively biased and anode 102 is positively biased causing current to flow through the fuse link 106 and electromigration to (i.e. silicide migration) to begin. In one embodiment, as shown in FIG. 8A, a metal layer 401 (only the outer edge of which is shown) is coupled in a heat transfer relationship to the cathode 104. The metal layer 401 is positioned in a parallel relationship above the cathode 104 at a predetermined distance covering at least a portion of the cathode 104, as viewed from above, but does not cover the fuse link 106. The metal layer 401 can be coupled to the cathode 104 as an integral part of the cathode contacts 405. FIG. 8A shows four contacts, however, more or less contacts are also contemplated. The metal layer 401 acts as a heat sink for the cathode 104. In at least one embodiment, the metal layer 401 is isolated from the fuse link 106 such that heat can only be transferred from the cathode 104.

In yet another embodiment, the temperature gradient is increased by selectively varying the thickness of an underlying oxide layer 801 such that the cathode 104 is disposed on a thinner layer of oxide than the fuse link 106. FIG. 8B illustrates the thinner oxide under only the cathode 104 The thinner layer of oxide between the cathode 104 and an underlying silicon layer 803 enables heat transferring between the two. Either alone or in combination, the thin oxide layer under and the metal layer 401 over the cathode 104 sinks heat and thus keeps the cathode 104 cooler compared to the fuse link 106, since the fuse link 106 is far from the heat sinks and is surrounded by more insulating material. When current flows through the fuse 100, a temperature gradient is set-up between the cathode 104 and the fuse link 106. Thus, the electromigration constant, the rate of electromigration being exponentially dependent on the temperature, is orders of magnitude different between the fuse link 106 and the cathode 104 (i.e. the electromigration in the fuse link 106 is much higher than in the cathode 104). This leads to a larger non-zero divergence in the material transported and assists in more efficient fuse programming.

An important element to electromigration programming is that the current directed through the fuse link 106 not be so large that it ruptures the link 106. This can happen, for instance, when the current level is larger than 15 mA for a fuse link width of approximately 0.10 to 0.15 microns. Under these extreme conditions the heat generated in the link 106 causes large thermally induced stresses due to the different thermal expansion coefficients of the link 106 and the surrounding materials. This can result in the physical rupture and/or random agglomeration of the link 106, an undesirable event that leads to reliability and yield issues.

Referring now to FIG. 10 there is shown a circuit for minimum feature CMOS technology current limiting electromigration programming in accordance with an exemplary embodiment of the present invention. For this exemplary embodiment, the fuse element 1010 (constructed, e.g., as shown in FIGS. 8A and 8B) has a width of approximately 0.12 micron and a length of approximately 1.2 micron and is connected in series with a transistor 1011 with gate oxide of 5.2 nm and an approximate width of 40 micron and a length of approximately 0.12 micron. A potential of approximately 3.3 volts is applied on the "blow" terminal 1012 and a programming signal or pulse with an approximate amplitude of 1.5 volts and width 200 microseconds is applied on the "select" terminal 1013 which results in a current of approximately 10 mA or less. The current causes the fuse link to heat up to roughly 600 C and above while the cathode is maintained around 100 C or less. It should be noted that this temperature is not sufficient to rupture the link but allows electromigration to happen.

This approach of programming can also be used in fuse-banks, as shown in FIG. 11, which are typically used to permanently store information (such as in Permanent Read Only Memory—PROM). In this exemplary embodiment, the fuses 1110 are coupled in parallel, each with its own series connected transistor 1111. Each fuse 1110 is also coupled to a common terminal for applying the 3.3 "blow" voltage in which serial latches 1112 are programmed with the pattern of fuses to be blown. Subsequent to applying 3.3 volts to the blow terminal, appropriate digital control circuitry 1113 enables appropriate transistors resulting in the programming of fuses corresponding to the pattern held in the serial latches 1112. Appropriate sense-circuitry can be similarly integrated to read the information stored in the fuses.

Although described in terms of silicide, polysilicon, and oxide materials, these materials should not be construed as limiting the present invention. Instead, these materials are employed to illustrate the present invention in an application.

Figure 3:
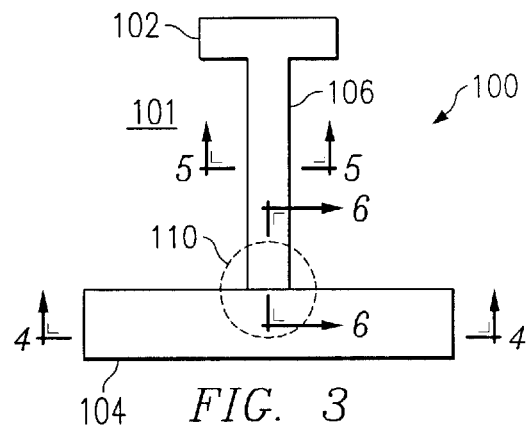
FIG. 3 illustrates a fuse structure in accordance with another exemplary embodiment of the present invention.

The following describes selective silicide structures which can be used in combination with the above-described techniques. Referring to FIG. 3, the cathode 104 of fuse structure 100 can include a material, which is less susceptible to material migration than anode 102 and fuse link 106. Preferably, at an intersection between cathode 104 and fuse link 106 a well-defined delineation of materials is provided. In this way, material migration effects are advantageously enhanced as well as concentrated or focused in a much smaller region, e.g., the intersection of cathode 104 and fuse link 106. For example, in a poly-silicided structure, cathode 104 is not silicided, e.g., cathode 104 is made of only heavily doped silicon. Anode 102 and fuse link 106 are preferably polysilicon with a silicide layer formed thereon.

Figure 4:
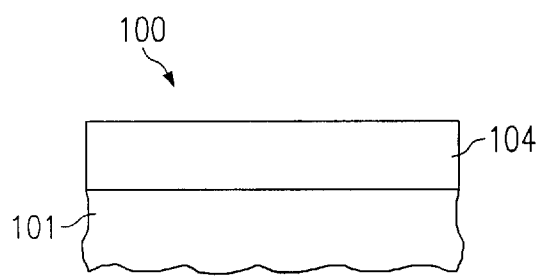
FIG. 4 illustrates a cross-sectional view of a cathode taken at section line 4—4 of FIG. 3.
Figure 5:
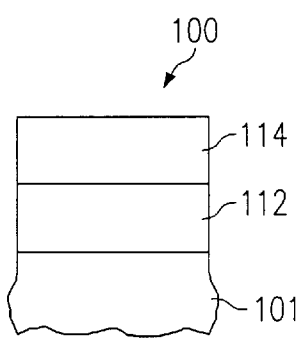
FIG. 5 illustrates a cross-sectional view of a fuse link taken at section line 5—5 of FIG. 3.

Referring to FIG. 4, a cross-section view of fuse 100 taken at section line 4—4 shows cathode 104 formed from a single material, e.g., unsilicided polysilicon. Turning to FIG. 5, a cross-sectional view of fuse 100 taken at section line 5—5 shows fuse link 106 formed from a layer of polysilicon material 112, e.g., unsilicided polysilicon, having a silicide layer 114 formed thereon (e.g., silicided polysilicon). It should be noted that the present invention may include a single material for fuse link 106 and a different material for cathode 104.

Figure 6:
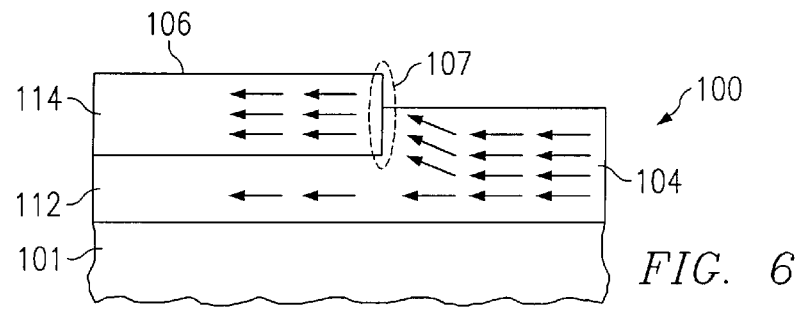
FIG. 6 illustrates a cross-sectional view of the fuse link to cathode junction taken at section line 6—6 of FIG. 3.

Referring now to FIG. 6, a cross-sectional view of fuse 100 taken at section line 6—6 shows a cathode to fuse link interface region. The selective silicidation of fuse structure 100 can be achieved by employing a masking layer during the silicidation (or salicidation) process oft he polysilicon. In this way, cathode 104 is protected from the silicidation (or salicidation) process. The silicide formation process consumes some of the polysilicon in fuse link 106. Hence, polysilicon layer 112 is thinner than the polysilicon of cathode 104.

When this structure is biased with the negative voltage applied to cathode 104 and positive voltage to anode 102, the electron wind (as indicated by arrows) will push the silicide molecules, especially in fuse link 106 where the current density is higher. Since cathode 104 is not silicided and includes polysilicon, the silicide in fuse link 106 that is moved towards the anode by the electron wind is not replaced at fuse link-cathode junction and a void is created. In this case, polysilicon is less affected than a silicide by electron migration.

Since the silicide has much lower resistivity than polysilicon, most of the electrons that carry the current will be crowded in the silicide in fuse-link 106 at the junction of the silicide and the un-silicided cathode. Advantageously, this current crowding in the vertical direction at a substantially perpendicular interface 107 adds to the crowding due the shape of the large cathode connected to the thinner fuse-link, and further amplifies the material migration effect at this junction. The fuse programming therefore takes place for fuse 100 much faster and at a lower voltage/current.

The present invention may be extended to any junction formed with a high material migrating substance and a lower material migration substance. The highly migrating material is preferably connected to the anode and lower migrating material is connected to the cathode. Such a structure, by creating a high current density at the junction, can be used as an electrical fuse. Highly migrating materials may include Al, Cu and Au and lower migrating materials may include W, Mo, and TiN (titanium nitride). The high/low migrating materials may include the following high/low migration pairs Al/W, Cu/TiN and Cu/W. Other materials are also contemplated. Combinations of several materials or layers of materials may also be employed by the present invention.

Figure 7:
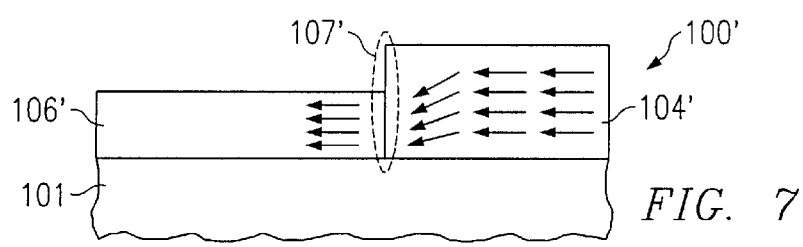
FIG. 7 illustrates a cross-sectional view of another embodiment of the fuse link to cathode junction taken at section line 6—6 of FIG. 3.

Referring now to FIG. 7, a cross-sectional view of fuse 100' taken at section line 6—6 shows another embodiment of the present invention. A cathode 104' includes a first material having low material migration susceptibility while fuse link 106' includes a different material with high material migration susceptibility to provide enhanced material migration at the cathode fuse link interface. Different thicknesses for cathode 104' and fuse link 106' may also be employed to further increase electron crowding in region 107'.

Earlier techniques for enhancing electrical fuse programming include creation of p-n junctions in the polysilicon. The above-described techniques can be used in conjunction with these earlier techniques, such as that described in U.S. Pat. No. 6,323,535, issued Nov. 27, 2001, entitled "Electrical Fuses Employing Reverse Biasing To Enhance Programming, the description of which is herein incorporated by reference.

Although a preferred embodiment of the method and system of the present invention has been illustrated in the accompanied drawings and described in the foregoing Detailed Description, it is understood that the invention is not limited to the embodiments disclosed, but is capable of numerous rearrangements, modifications, and substitutions without departing from the spirit of the invention as set forth and defined by the following claims.

What is claimed is:

1. A system for programming via electromigration, comprising:
- a semiconductor fuse structure having a cathode and an anode coupled by a conductive fuse link;
- a current supply coupled to said semiconductor fuse structure and adapted to supply a current of sufficient magnitude to initiate electromigration in said fuse link; and
- said semiconductor fuse structure including a temperature gradient device adapted to effectuate a temperature gradient between said fuse link and said cathode and during said electromigration.

2. The system of claim 1, wherein said current supply comprises a transistor coupled to one of said cathode and said anode and is further adapted to limit said current to a magnitude insufficient to rupture said fuse link during said electromigration.

3. The system of claim 1, wherein said temperature gradient device comprises a heat sink coupled in a heat transfer relationship with said cathode and adapted to transfer heat therefrom.

4. The system of claim 1, wherein said temperature gradient device comprises an insulating layer disposed on said cathode and said fuse link, said insulating layer having a selectively varied thickness such that the thickness adjacent said fuse link is greater than adjacent said cathode.

5. The system of claim 4, wherein said insulating layer is an oxide layer.

6. The system of claim 1, wherein said temperature gradient device comprises:
- an oxide layer adjacent said cathode and said fuse link, said oxide layer having a selective varied thickness such that the thickness adjacent said fuse link is greater than that adjacent said cathode; and
- a heat sink coupled in a heat transfer relationship with said cathode and adapted to transfer heat therefrom.

7. A semiconductor integrated circuit apparatus, comprising:
- a plurality of semiconductor fuse structures, each having a cathode and an anode coupled by a conductive fuse link;
- a current supply coupled to said semiconductor fuse structures and adapted to supply a current of sufficient magnitude to initiate electromigration in any of said fuse links;
- each of said semiconductor fuse structures including a temperature gradient device adapted to effectuate a temperature gradient between said fuse link and said cathode and during said electromigration; and
- control circuit coupled to said current supply for causing said current supply to supply said current selectively to the fuse link of at least one of said semiconductor fuse structures.

8. The apparatus of claim 7, wherein said temperature gradient device comprises a heat sink coupled in a heat transfer relationship with said cathode and adapted to transfer heat therefrom such that said fuse link is maintained at a higher temperature than said cathode during said electromigration.

9. The apparatus of claim 7, wherein said temperature gradient device comprises an insulating layer adjacent said cathode and said fuse link, said insulating layer having a selectively varied thickness such that the thickness adjacent said fuse link is greater than the thickness adjacent said cathode.

10. The apparatus of claim 9, wherein said insulating layer is an oxide layer.

11. The apparatus of claim 7, wherein said temperature gradient device comprises:
- an insulating layer adjacent said cathode and said fuse link, said insulating layer having a selectively varied thickness such that the thickness adjacent said fuse link is greater than the thickness adjacent said cathode; and
- a heat sink coupled in a heat transfer relationship with said cathode and adapted to transfer heat therefrom such that said fuse link is maintained at a higher temperature than said one of said cathode during said electromigration.

12. The apparatus of claim 7, wherein said temperature gradient device comprises a metal layer coupled in a heat transfer relationship with said cathode and adapted to transfer heat therefrom.

* * * * *